United States Patent [19]
Park et al.

[11] Patent Number: 5,928,820
[45] Date of Patent: Jul. 27, 1999

[54] METHOD FOR MEASURING PATTERN LINE WIDTH DURING MANUFACTURE OF A SEMICONDUCTOR DEVICE

[75] Inventors: Ki Yeop Park; Cheol Kyu Bok, both of Ichonkun, Rep. of Korea

[73] Assignee: Hyundai Electronics Industries Co., Ltd., Kyoungkido, Rep. of Korea

[21] Appl. No.: 08/566,373

[22] Filed: Dec. 1, 1995

Related U.S. Application Data

[63] Continuation of application No. 08/258,426, Jun. 10, 1994, abandoned.

[51] Int. Cl.⁶ ................................. G03F 9/00; G03F 7/20
[52] U.S. Cl. .............................. 430/22; 430/311; 430/396
[58] Field of Search ................................. 430/5, 22, 311, 430/396

[56] References Cited

U.S. PATENT DOCUMENTS

| | | | |
|---|---|---|---|
| 4,138,253 | 2/1979 | Farrand | 430/396 |
| 5,262,258 | 11/1993 | Yanagisawa | 430/22 |

Primary Examiner—Kathleen Duda
Attorney, Agent, or Firm—Merchant, Gould Smith, Edell Welter & Schmidt

[57] ABSTRACT

A method for measuring the line width dimensions of a photosensitive film pattern formed during manufacture of a semiconductor device is disclosed. The method uses a photomask which comprises a first auxiliary pattern part having a plurality of first auxiliary patterns separated by a first separation distance therebetween and having substantially the same width dimension as a semiconductor device line pattern formed on a wafer. A second auxiliary pattern part, spaced apart from the first auxiliary pattern part, includes a plurality of second auxiliary patterns separated by a second separation distance therebetween and having substantially the same width dimension as the first auxiliary patterns, the second separation distance being different from the first separation distance. One side of at least one of the second auxiliary patterns is preferably aligned with one side of at least one of the first auxiliary patterns. A larger or smaller width of lines in patterns of the photosensitive film corresponding to these auxiliary patterns of the photomask as observed with a microscope connotes line width dimension information.

3 Claims, 4 Drawing Sheets

(PROIR ART)

(PROIR ART)

(PROIR ART)

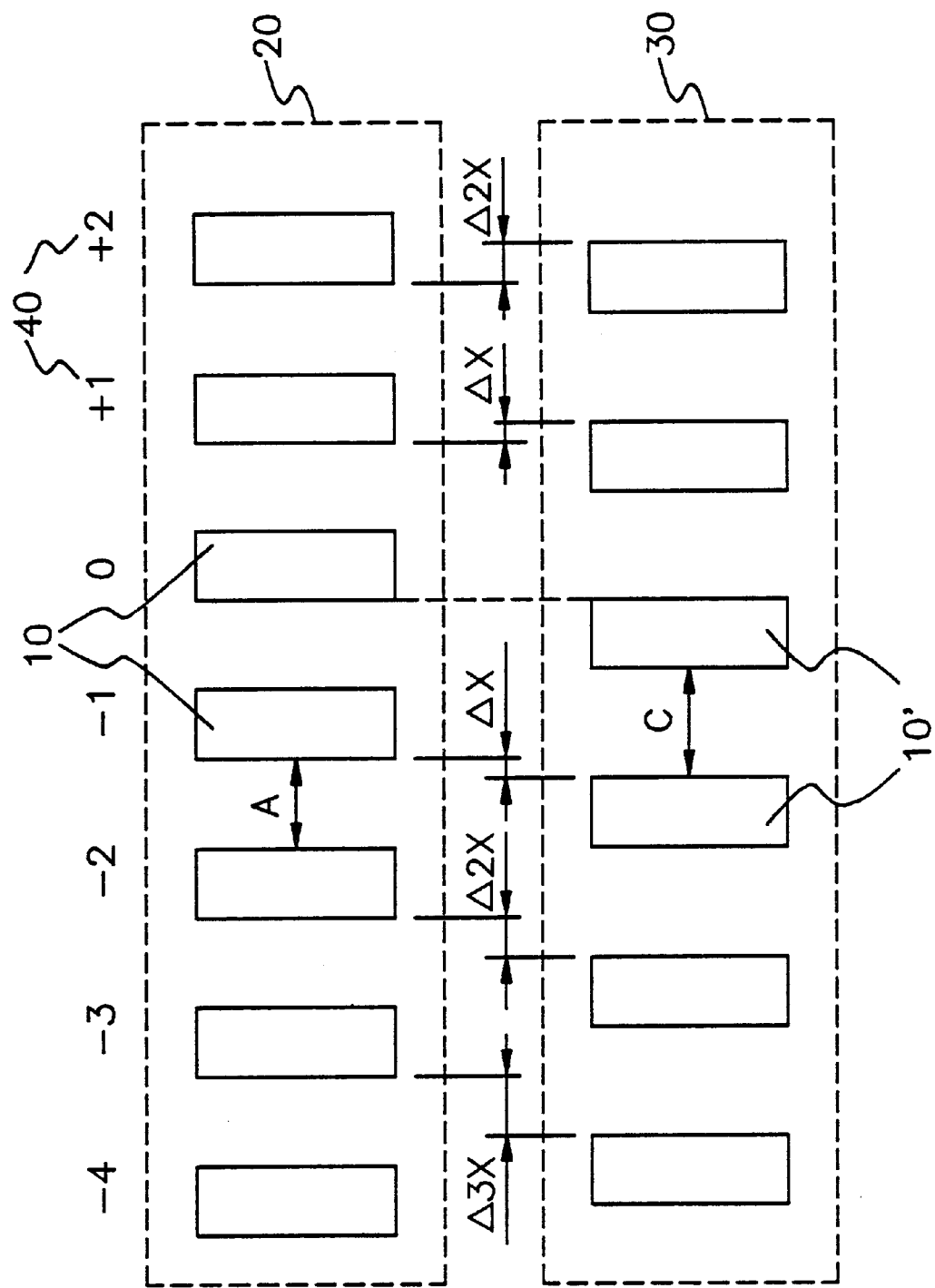

METHOD FOR MEASURING PATTERN LINE WIDTH DURING MANUFACTURE OF A SEMICONDUCTOR DEVICE

This is a continuation of application Ser. No. 08/258,426, filed Jun. 10, 1994, now abandoned.

BACKGROUND OF THE INVENTION

Field of the Invention

The present invention relates to a photomask useful in semiconductor devices fabricating, and, in particular, to a photomask capable of facilitating the measurement of the width of a line pattern formed during manufacture of a semiconductor device.

DESCRIPTION OF THE PRIOR ART

To form a predetermined pattern on a wafer, a lithography process is generally carried out, and its accuracy may generally be determined by measuring the width of a line patterned on the wafer.

In order to better understand the background of the present invention, there will be given a description of a conventional process for forming a pattern using lithography, with reference to FIGS. 1A through 1C.

Initially, on a wafer 1, there is formed a polysilicon film 2 of some thickness which is to be later patterned, and over which a photosensitive film 3 is coated. Subsequently, the photosensitive film 3 is exposed to a light using a mask 4 of a predetermined pattern having a width of Xm, as shown in FIG. 1A.

Subsequently, the photosensitive film 3 exposed to the light is eliminated through a developing process, so as to develop a pattern 3' of photosensitive film with a width of Xp, as shown in FIG. 1B.

Finally, using the pattern 3' of photosensitive film as an etching mask, the polysilicon film 2 is subjected to etch, so as to form a pattern 2' of polysilicon film with a width of Xe, as shown in FIG. 1C.

Through the process illustrated, the difference between the width of the chrome pattern of the mask 4 and that of the pattern 3' of the photosensitive film, referred to as Xm–Xp, may be determined. Similarly, the difference between the width of the chrome pattern of the mask 4 and that of the pattern 2' formed by etching the polysilicon film 2 masked by the photosensitive film pattern 3' referred to as Xm–Xe, may also be determined. The former difference (Xm–Xp) is called a bias of photolithography, while the latter difference (Xm–Xe) is called a bias of etch. Such differences or biases associated with the pattern of the mask 4 depend on the variation in the energy of the irradiation and the type of the etching atmosphere.

The measurement of the line widths (Xp) in the pattern 3' of photosensitive film 3, as well as the line widths (Xe) in the other pattern 2' formed through the photosensitive film pattern 3', both of which are different from the chrome pattern of the mask 4 in width (Xm), is generally accomplished using a scanning electron microscope (hereinafter referred to as "SEM"), which is an expensive high-precision measuring apparatus for determining such critical dimensions (hereinafter referred to as "CD").

However, it takes an SEM an average of 5 hours and 10 minutes to measure such CDs for a sheet of wafers. Still worse, accurate measurement is not often accomplished due to the resultant damage to the photosensitive film 3 by the SEM measuring equipment.

SUMMARY OF THE INVENTION

Therefore, an object of the present invention is to overcome the aforementioned problems encountered in the prior art, and to provide method using a photomask that affords simple and safe measuring of the line width of a pattern of photosensitive film.

In accordance with the present invention, the above object can be accomplished as indicated in the "Background of the Invention" by forming a photosensitive film on a wafer, placing a photomask over said photosensitive film, exposing said photomask and said photosensitive film to light and eliminating exposed portions of the photosensitive film through a developing process to create the line width dimension and to create photosensitive film patterns on said photomask. As indicated in the "Detailed Description of the Invention", the line width dimensions of first and second auxiliary pattern parts are the same as the line width dimension of the objective pattern. After the developing process, a microscope is used to observe said photosensitive film patterns to measure said width dimension for said line. The photomask has an objective pattern for forming the line and has an objective line width dimension. The photomask also has first and second auxiliary pattern parts. The first auxiliary pattern part has a plurality of spaced apart first auxiliary patterns with sides spaced apart by a first width dimension. Each of the first auxiliary patterns is separated from an adjacent one of the first auxiliary patterns by a first separation distance. The second auxiliary pattern part is positioned below the first auxiliary pattern part. The second auxiliary pattern part has a plurality of spaced apart second auxiliary patterns with sides spaced apart by a second width dimension. The first and second width dimensions are the same as the objective line width dimension. Each of the second auxiliary patterns is separated from an adjacent one of the second auxiliary patterns by a second separation distance different from the first separation distance. The side of at least one of the plurality of second auxiliary patterns is in alignment with the side of at least one of the plurality of first auxiliary patterns.

BRIEF DESCRIPTION OF THE DRAWINGS

The above object and other advantages of the present invention will become more apparent by the description of a preferred embodiment of the present invention with reference to the attached drawings, in which:

FIG. 2 is a schematic view showing a photomask having an arrangement of auxiliary pattern in accordance with the present invention.

DETAILED DESCRIPTION OF THE INVENTION

Figure 1A:
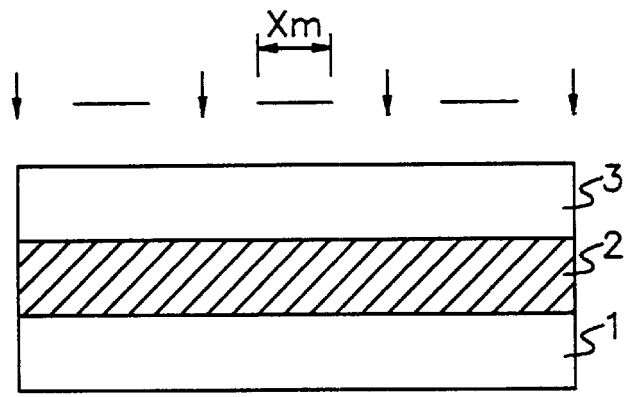
FIGS. 1A through 1C are schematic, cross sectional views illustrating a lithography process using a conventional photomask.
Figure 1B:
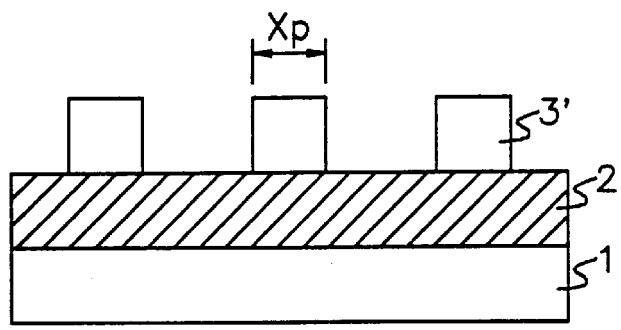
Figure 1C:
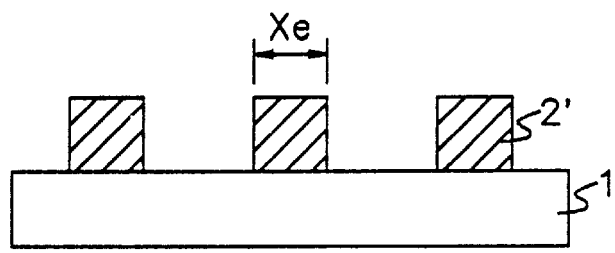

Hereinafter, the preferred embodiment of the present invention will be explained with reference to the accompanying drawings, wherein like reference numerals designate like parts, respectively.

Referring initially to FIG. 2, there are shown a plurality of auxiliary patterns 10 and 10' respectively disposed in a predetermined region of a mask which are provided to facilitate the measurement of line widths. As shown in this figure, the auxiliary patterns 10 and 10' are respectively arranged either in an upper group 20 or in a lower group 30. In the upper group 20, the auxiliary patterns 10 are arranged in a parallel relationship with a constant separation distance A there between. In contrast, the auxiliary patterns 10' of the lower group 30 are arranged in a parallel relationship with a constant separation distance C there between. The separation distance A between the auxiliary patterns 10 of the upper group 20 is designed to be different from the separation distance C between the auxiliary patterns 10' of the lower group 30. The separation distances A and C are appropriately determined in consideration of the resolution power of a photolithographic stepper.

In addition, the auxiliary pattern 10 of the upper group 20 and the auxiliary pattern 10' of the lower group 30 have the same line width as a pattern which is to be formed on a die.

On a photomask fabricated in accordance with the present invention, there are formed marking patterns 40, comprising numerals, to delineate the order of arrangement of each of the auxiliary patterns 10 and 10', which are represented as integers on the mask shown in FIG. 2. With further reference to the alignment relationship between the auxiliary patterns 10 and 10', it can be seen that at a region "0" of the marking patterns 40, one side of the auxiliary pattern 10 at the region "0" in the upper group 20 is aligned coincident with one side of the auxiliary pattern 10' of the lower group 30, as indicated by the dashed line. At region "0" as shown in FIG. 2, one vertical side of the upper auxiliary pattern 10 is offset from one vertical side of the lower auxiliary pattern 10' by a distance $\Delta x$ at +1 and −1 regions of the marking pattern 40, and offset a distance $2\Delta x$ at +2 and −2 regions, and so on.

Figure 3A:
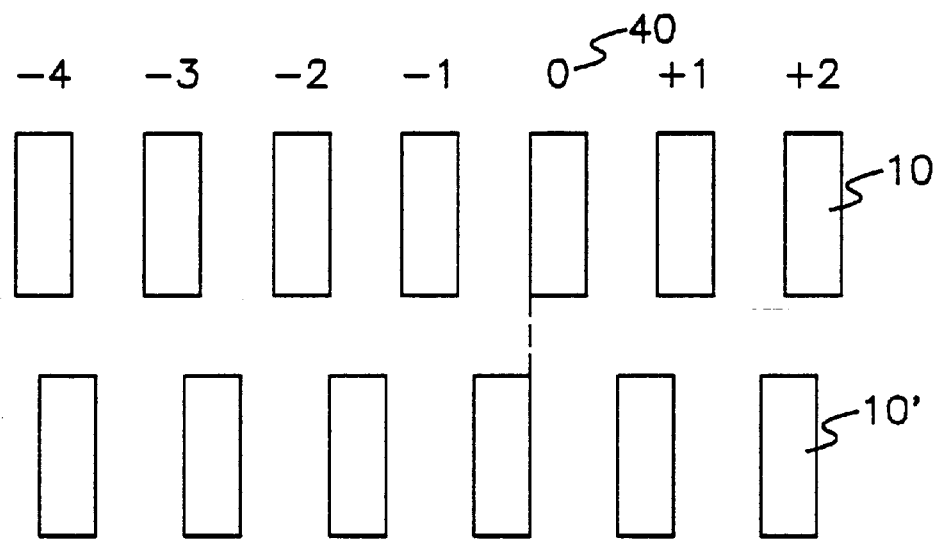
FIGS. 3A through 3C are schematic plan views showing many sets of auxiliary patterns developed on a wafer by use of the photomask of FIG. 2.
Figure 3B:
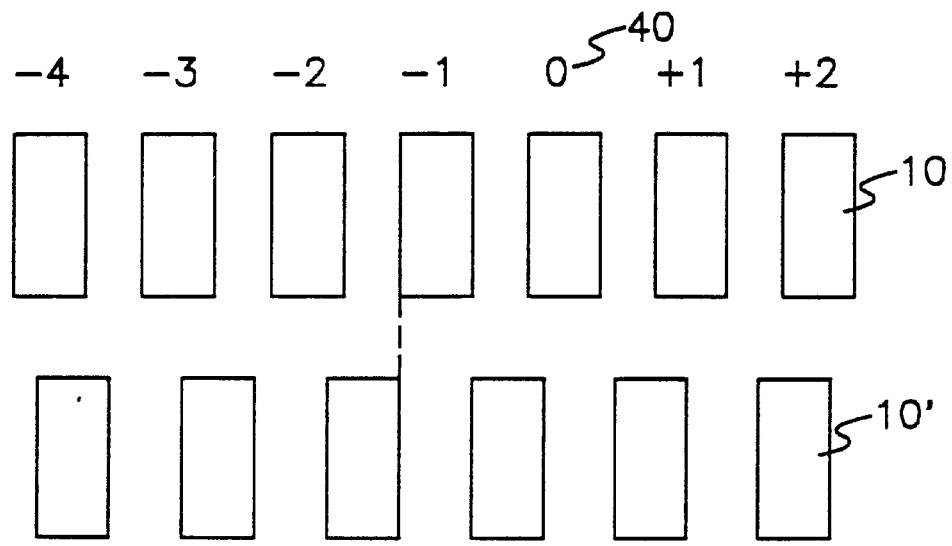
Figure 3C:
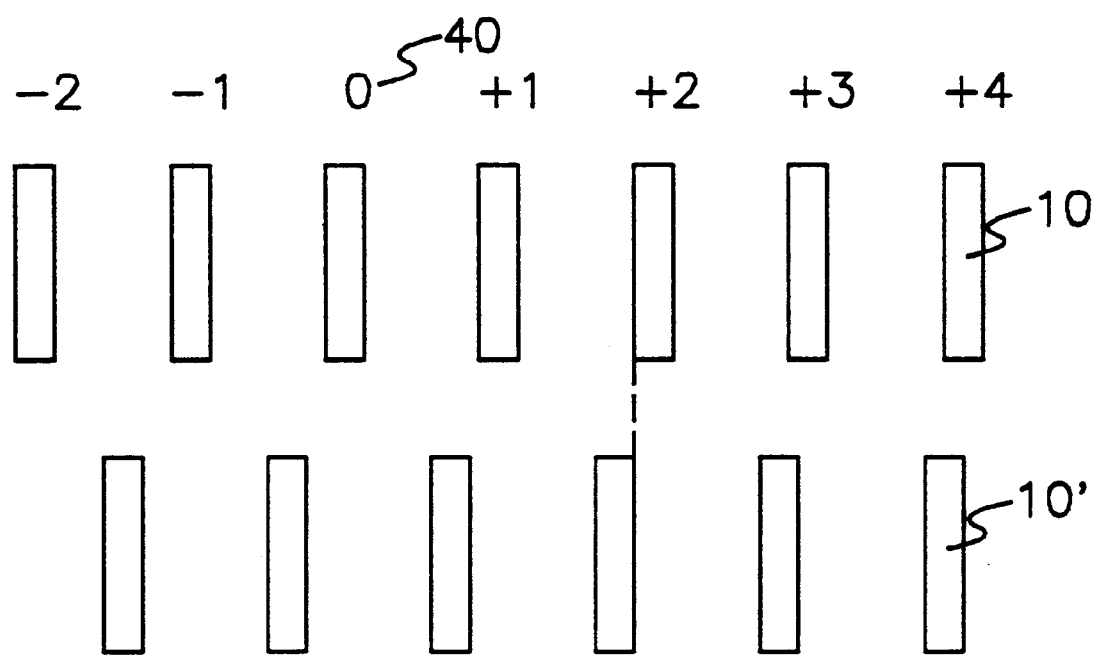

Referring now to FIGS. 3A to 3C, there are shown sets of patterns formed on scribe lines by use of the mask of FIG. 2.

FIG. 3A shows an arrangement of auxiliary patterns 11 and 11' which arises when photosensitive film patterns having the same line width as the auxiliary patterns 10 and 10' of the mask are formed on the wafer. In this case, it can be confirmed only with a microscope that one side of an upper auxiliary pattern 11 is coincident with one side of a lower auxiliary pattern 11' at a region "0" of the marking patterns 40. Accordingly, it can be easily observed and confirmed that the pattern of the mask and the pattern formed on a wafer have line widths of the same size after formation of the pattern on the wafer.

FIG. 3B shows that the coincidence between the upper auxiliary pattern 11 and the lower auxiliary pattern 11' occurs at the first region on the left hand side of the region "0" of the marking patterns 40, that is, at the region "−1". In this case, it is recognized that the pattern formed on a wafer is wider than the pattern of the mask. In other words, the line width of the pattern formed on the wafer is $\Delta x$ greater than that of the pattern of the mask as indicated by the coincidence shown at the region "−1".

FIG. 3C shows that the coincidence between the upper auxiliary pattern 11 and the lower auxiliary pattern 11' occurs at the second region on the right hand side of the region "0" of the marking patterns 40, that is, at a region "+2". In this case, it is recognized that the pattern formed on a wafer is narrower than the pattern of the mask. In particular, the line width of the pattern formed on the wafer is $2\Delta x$ less than that of the line width of the pattern of the mask.

As described hereinbefore, the line width of patterns developed on a wafer can be measured simply by observing with a microscope which numerical indicator associated with one side of one of the upper patterns 11 is coincident with one side of one of the lower patterns 11'. Accordingly, measuring the line widths of semiconductor device patterns in accordance with the present invention can be accomplished in a significantly shorter amount of time than when using conventional measuring equipment, such as, for example, SEM, and that such measurements can be performed without damaging the photosensitive film resulting from use of conventional measurement equipment.

Other features, advantages, and embodiments of the invention disclosed herein will be readily apparent to those of ordinary skill after reading the foregoing disclosures. In this regard, while specific embodiments of the invention have been described in considerable detail, variations and modifications of these embodiments can be effected without departing from the spirit and scope of the present invention as described and claimed.

What is claimed is:

1. A method of measuring a width dimension of a line in a lithography process, the method comprising the steps of:

forming a photosensitive film on a wafer;

placing a photomask over said photosensitive film, said photomask having an objective pattern for forming said line and having an objective line width dimension, said photomask also having first and second auxiliary pattern parts, said first auxiliary pattern part having a plurality of spaced apart first auxiliary patterns with sides spaced apart by a first width dimension, each of said first auxiliary patterns being separated from an adjacent one of said first auxiliary patterns by a first separation distance, said second auxiliary pattern part being positioned below said first auxiliary pattern part, said second auxiliary pattern part having a plurality of spaced apart second auxiliary patterns with sides spaced apart by a second width dimension, said first and second width dimensions being the same as said objective line width dimension, each of said second auxiliary patterns being separated from an adjacent one of said second auxiliary patterns by a second separation distance different from said first separation distance, the side of at least one of the plurality of second auxiliary patterns being in alignment with the side of at least one of the plurality of first auxiliary patterns;

exposing said photomask and said photosensitive film to light and eliminating exposed portions of the photosensitive film through a developing process to create the line with width dimension and to create photosensitive film patterns corresponding with said auxiliary patterns on said photomask; and observing with a microscope said photosensitive film patterns to measure said width dimension for said line.

2. A method as recited in claim 1, wherein the photomask further includes a plurality of marking patterns positioned adjacent one of the first auxiliary patterns and the second auxiliary patterns to provide an indication of the width dimension for said line.

3. A method as recited in claim 2, wherein the marking patterns comprise numerals.

\* \* \* \* \*